US009627461B2

(12) United States Patent
Xie

(10) Patent No.: US 9,627,461 B2
(45) Date of Patent: Apr. 18, 2017

(54) ARRAY SUBSTRATE, ITS MANUFACTURING METHOD AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Zhenyu Xie, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/771,320

(22) PCT Filed: Jan. 16, 2015

(86) PCT No.: PCT/CN2015/070885
§ 371 (c)(1),
(2) Date: Aug. 28, 2015

(87) PCT Pub. No.: WO2016/045270
PCT Pub. Date: Mar. 31, 2016

(65) Prior Publication Data
US 2016/0351643 A1    Dec. 1, 2016

(30) Foreign Application Priority Data

Sep. 25, 2014    (CN) .......................... 2014 1 0498723

(51) Int. Cl.
*H01L 27/32* (2006.01)
*H01L 27/12* (2006.01)
*H01L 21/77* (2017.01)

(52) U.S. Cl.
CPC .......... *H01L 27/3262* (2013.01); *H01L 21/77* (2013.01); *H01L 27/12* (2013.01);
(Continued)

(58) Field of Classification Search
CPC combination set(s) only.
See application file for complete search history.

(56) References Cited

U.S. PATENT DOCUMENTS

2005/0110011 A1* 5/2005 Im .................... H01L 27/1248
257/40
2008/0258196 A1* 10/2008 Chen ................. G02F 1/136213
257/296

(Continued)

FOREIGN PATENT DOCUMENTS

CN    101206325 A    6/2008
CN    102709185 A    10/2012
(Continued)

OTHER PUBLICATIONS

First Office Action regarding Chinese application No. 201410498723.9, dated Oct. 25, 2016. Translation provided by Dragon Intellectual Property Law Firm.
(Continued)

*Primary Examiner* — Mamadou Diallo
(74) *Attorney, Agent, or Firm* — Harness, Dickey & Pierce, P.L.C.

(57) ABSTRACT

The present disclosure provides an array substrate, its manufacturing method and a display device. The array substrate includes a thin film transistor. A source electrode and a drain electrode are located above a pattern of an active layer, and the source electrode and the drain electrode are in electrical contact with the pattern of the active layer through a first via-hole penetrating an insulating structure. Before the formation of the source electrode and the drain electrode, the
(Continued)

pattern of the active layer is subjected to ion injection through the first via-hole, so as to form an ion injection region.

20 Claims, 4 Drawing Sheets

(52) U.S. Cl.
CPC ........ *H01L 27/124* (2013.01); *H01L 27/1255* (2013.01); *H01L 27/1259* (2013.01); *H01L 27/1288* (2013.01); *H01L 27/3258* (2013.01); *H01L 27/3265* (2013.01); *H01L 27/3276* (2013.01); *H01L 2227/323* (2013.01)

(56) References Cited

U.S. PATENT DOCUMENTS

| | | | |
|---|---|---|---|
| 2009/0218574 A1* | 9/2009 | Noda | ......... H01L 27/1214 257/72 |
| 2010/0032681 A1* | 2/2010 | Kuriyagawa | ..... H01L 29/78621 257/72 |
| 2010/0181570 A1* | 7/2010 | Katoh | ......... G02F 1/1368 257/59 |
| 2011/0024763 A1* | 2/2011 | Noda | ......... G02F 1/1368 257/72 |
| 2016/0043351 A1* | 2/2016 | Hsu | ......... H01L 51/002 438/99 |

FOREIGN PATENT DOCUMENTS

| | | |
|---|---|---|
| CN | 103107095 A | 5/2013 |
| CN | 103296034 A | 9/2013 |
| JP | H05-275449 A | 10/1993 |
| JP | H07-193252 A | 7/1995 |

OTHER PUBLICATIONS

Written Opinion of the International Searching Authority and International Search Report regarding international application No. PCT/CN2015/070885, filed Jan. 16, 2015.

* cited by examiner

ARRAY SUBSTRATE, ITS MANUFACTURING METHOD AND DISPLAY DEVICE

CROSS-REFERENCE TO RELATED APPLICATION

The present application is the U.S. national phase of PCT Application No. PCT/CN2015/070885 filed on Jan. 16, 2015, which claims a priority of the Chinese patent application No. 201410498723.9 filed on Sep. 25, 2014, which is incorporated herein by reference in its entirety.

TECHNICAL FIELD

The present disclosure relates to the field of display technology, in particular to an array substrate, its manufacturing method and a display device.

BACKGROUND

An active matrix organic light-emitting diode (AMOLED) display device is a novel flat-panel display device. Due to a self-luminescent function of the OLED, no backlight source is required by the AMOLED display device. As compared with a liquid crystal display device, the AMOLED display device has a wider viewing angle and a higher contrast, as well as such advantages as a small size, a small weight and lower power consumption. In addition, a thin film transistor (TFT) is driven by a low direct current, so as to transmit a pixel voltage to the OLED for displaying, so the AMOLED display device further has an advantage of rapid response. Moreover, the AMOLED display device may be operated at a wider temperature range, and the production cost thereof is relatively low.

TFT may include p-Si TFT and a-Si TFT, with difference in the characteristics. Due to its own defect, e.g., a low on-state current, low mobility and weak stability caused by many defect states, the application of a-Si in many fields has been restrained. However, molecules of p-Si are arranged in one grain regularly and directionally, and the mobility of electrons is 200 to 300 times greater than that of the electrons in a-Si where the molecules are arranged irregularly, so p-Si has been widely used nowadays.

In the related art, a process for manufacturing the AMOLED includes steps of: depositing an insulating structure onto a pattern of an active layer, and forming a via-hole in the insulating structure so as to expose the active layer; and forming a source electrode and a drain electrode on the insulating structure, the source electrode and the drain electrode being electrically connected to the active layer through the via-hole.

When the insulating structure includes at least two insulating layers and the via-holes are formed in the insulating structure, it is required to etch these insulating layers simultaneously. Due to an uneven thickness of the layer and thereby an uneven etching degree, in order to ensure the formation of a first via-hole at each position on a glass substrate without any residual layer, usually the layer may be over-etched by, e.g., 40%. It means that, during the etching procedure, the active layer at the via-hole needs to be subjected to ion bombardment for a long period of time, which thus results in a rough surface of the active layer at the via-hole and an increase in the number of the defects. When the source electrode and the drain electrode are formed subsequently, a characteristic of the metal-semiconductor contact, and thereby an on-state characteristic of the entire TFT, will be affected adversely.

SUMMARY

An object of the present disclosure is to provide an array substrate, its manufacturing method and a display device, so as to prevent the occurrence of a rough surface of an active layer below a via-hole during the etching of the via-hole in an insulating structure, thereby to improve an on-state characteristic of a TFT.

In one aspect, the present disclosure provides in one embodiment a method for manufacturing an array substrate, including a step of forming a TFT. The step of forming the TFT includes: forming a pattern of an active layer on a substrate; forming an insulating structure on the pattern of the active layer; forming a first via-hole penetrating the insulating structure so as to expose the pattern of the active layer at a position corresponding to the first via-hole, the first via-hole extending to an interior of the exposed pattern of the active layer; subjecting the exposed pattern of the active layer to ion injection through the first via-hole, so as to form an ion injection region located in pattern of the active layer; and forming a source electrode and a drain electrode on the insulating structure, the source electrode and the drain electrode being in contact with a surface of the ion injection region through the first via-hole so as to be electrically connected to the pattern of the active layer.

In another aspect, the present disclosure provides in one embodiment an array substrate including a TFT. The TFT further includes: a pattern of an active layer on a substrate; an insulating structure covering the pattern of the active layer, a first via-hole being formed in the insulating structure and extending to an interior of an exposed pattern of the active layer; an ion injection region located in the pattern of the active layer and at a position corresponding to the first via-hole; and a source electrode and a drain electrode arranged on the insulating structure, the source electrode and the drain electrode being in contact with a surface of the ion injection region through the first via-hole so as to be electrically connected to the pattern of the active layer.

In yet another aspect, the present disclosure provides in one embodiment a display device including the above-mentioned array substrate.

According to the embodiments of the present disclosure, the source electrode and the drain electrode of the TFT are located above the pattern of the active layer, and electrically connected to the pattern of the active layer through the first via-hole penetrating the insulating structure. Before the formation of the source electrode and the drain electrode, the exposed pattern of the active layer is subjected to ion injection through the first via-hole penetrating the insulating structure, so as to form the ion injection region. As a result, it is able to repair the damaged surface of the pattern of the active layer due to an etching process for forming the via-hole, thereby to improve the metal-semiconductor electrical contact between the source/drain electrode and the pattern of the active layer, improve the electrical characteristic of the TFT and ensure the display quality of the display device.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to a part of the embodiments of the present disclosure, and based on these drawings, a person skilled in the art may, without any creative effort, obtain the other drawings.

DETAILED DESCRIPTION

Figure 1:
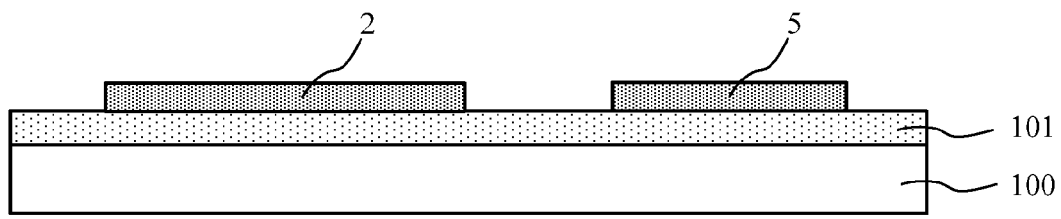
FIGS. 1-8 are schematic views showing a procedure of forming an AMOLED according to one embodiment of the present disclosure.

During the manufacture of an array substrate, usually different conductive layers are electrically connected to each other through via-holes in an insulating layer, i.e., the different conductive layers are in electrical contact with each other through the via-holes in the insulating layer. When source/drain electrodes of a TFT are in metal-semiconductor electrical contact with a pattern of an active layer through the via-holes in the insulating layer (i.e., when a source/drain metal layer is in electrical contact with the active layer), the pattern of the active layer at a position corresponding to the via-hole will also be etched during the etching process of the via-hole, so as to ensure fully etch the via-hole in the insulating layer. As a result, the pattern of the active layer at the position corresponding to the via-hole will be of a rough surface, and the metal-semiconductor electrical contact between the subsequently-formed source/drain electrodes and the pattern of the active layer as well as the electrical characteristics of the entire TFT will be adversely affected.

In order to overcome the above defects, the present disclosure provides in the embodiments an array substrate and its manufacturing method. The method includes steps of: forming a first via-hole in an insulating structure on an pattern of an active layer, so as to expose the pattern of the active layer at a position corresponding to the first via-hole; and subjecting the exposed pattern of the active layer to ion injection through the first via-hole, so as to form an ion injection region, thereby to enable subsequently-formed source electrode and drain electrode to be in electrical contact with the ion injection region of the pattern of the active layer through the first via-hole. As a result, it is able to improve the metal-semiconductor electrical contact between the source and drain electrodes and the pattern of the active layer as well as the electrical characteristics of a TFT.

The present disclosure will be described hereinafter in conjunction with the drawings and embodiments. The following embodiments are for illustrative purposes only, but shall not be used to limit the scope of the present disclosure.

The present disclosure provides in one embodiment a method for manufacturing an array substrate, which includes a step of forming a TFT. The step of forming the TFT includes: Step S1 of forming a pattern of an active layer on a substrate; Step S2 of forming an insulating structure on the pattern of the active layer; Step S3 of forming a first via-hole penetrating through the insulating structure so as to expose the pattern of the active layer at a position corresponding to the first via-hole, the first via-hole extending to an interior of the exposed pattern of the active layer; Step S4 of subjecting the exposed pattern of the active layer to ion injection through the first via-hole, so as to form an ion injection region located in pattern of the active layer; and Step S5 of forming a source electrode and a drain electrode on the insulating structure, the source electrode and the drain electrode being in contact with a surface of the ion injection region through the first via-hole so as to be electrically connected to the pattern of the active layer.

According to the above method in the embodiment of the present disclosure, before forming the source electrode and the drain electrode, the exposed pattern of the active layer is subjected to ion injection through the first via-hole in the insulating structure, so as to form the ion injection region, thereby to repair the damaged surface of the pattern of the active layer due to the etching process of the first via-hole. As a result, it is able to improve the metal-semiconductor electrical contact between the source/drain electrodes and the pattern of the active layer as well as the electrical characteristics of the TFT, thereby to ensure the quality of the array substrate.

The present disclosure further provides in one embodiment an array substrate which includes a TFT. The TFT includes: a pattern of an active layer on a substrate; an insulating structure covering the pattern of the active layer, a first via-hole being formed in the insulating structure to expose the pattern of the active layer, and extending to an interior of the exposed pattern of the active layer; an ion injection region located in the pattern of the active layer and at a position corresponding to the first via-hole; and a source electrode and a drain electrode arranged on the insulating structure, the source electrode and the drain electrode being in contact with a surface of the ion injection region through the first via-hole so as to be electrically connected to the pattern of the active layer.

In the related art, the TFT may de divided into poly-Si TFT and a-Si TFT depending on materials of the active layer. Molecules of p-Si are arranged in one grain regularly and directionally, and the mobility of electrons is 200 to 300 times greater than that of the electrons in a-Si where the molecules are arranged irregularly, so p-Si has been widely used nowadays.

Figure 8:
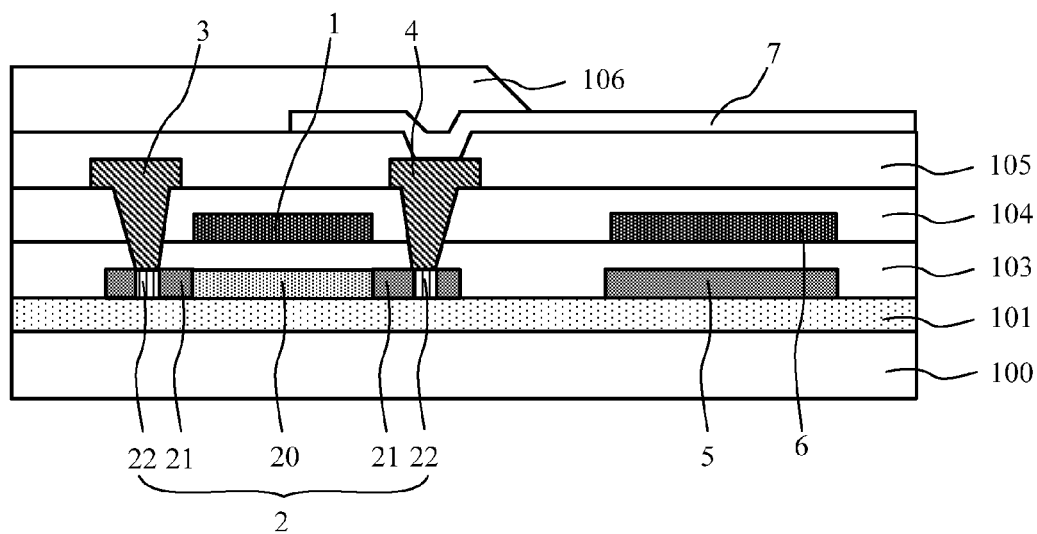
Figure 9:
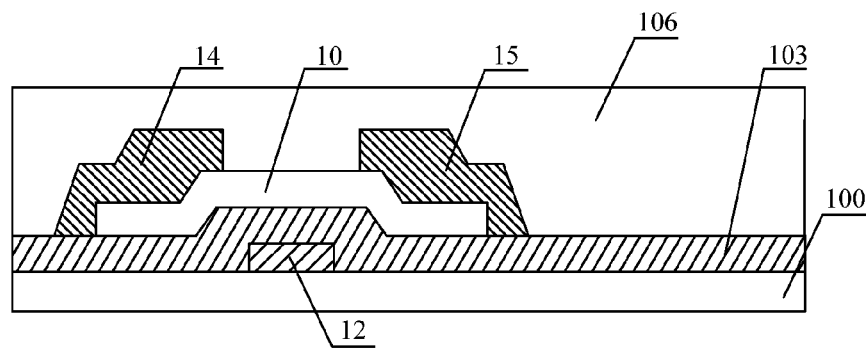
FIG. 9 is a schematic view showing a bottom-gate TFT according to one embodiment of the present disclosure.
Figure 10:
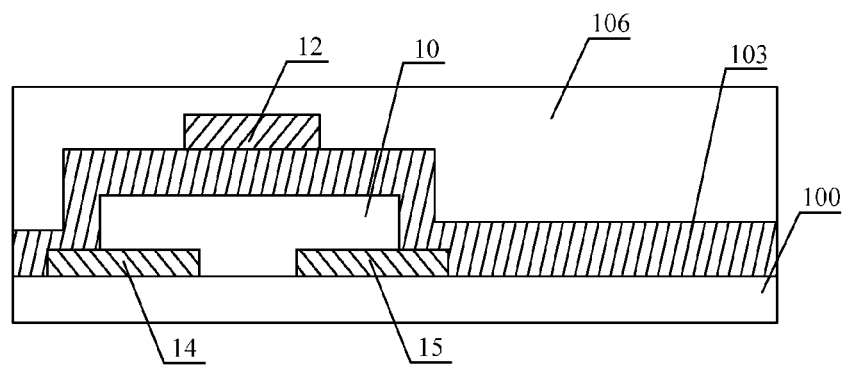
FIG. 10 is a schematic view showing a top-gate TFT according to one embodiment of the present disclosure.

Depending on the structure of the layers, the TFT may include a bottom-gate TFT, a top-gate TFT and a co-planar TFT. As shown in FIG. 9, the bottom-gate TFT includes a gate electrode 12, a gate insulating layer 103, an pattern of an active layer 10, a source electrode 14, a drain electrode 15 and a passivation layer 106 sequentially formed on a substrate 100. As shown in FIG. 10, the top-gate TFT includes the source electrode 14, the drain electrode 15, the pattern of the active layer 10, the gate insulating layer 103, the gate electrode 12 and the passivation layer 106 subsequently formed on the substrate 100. As shown in FIG. 8, the co-planar TFT includes the pattern of an active layer 2, the gate insulating layer 103, a gate electrode 1, an interlayered insulating layer 104, a source electrode 3, a drain electrode 4 and a passivation layer 105 sequentially formed on the substrate 100.

As can be seen from the above, for the co-planar TFT, the source electrode 3 and the drain electrode 4 are electrically connected to the pattern of the active layer 2 through a via-hole penetrating the gate insulating layer 103 and the interlayered insulating layer 104. During the manufacture of the via-hole, it is required to etch the gate insulating layer 103 and the interlayered insulating layer 104 simultaneously. Due to an uneven thickness of the layer on the substrate 100 and thereby an uneven etching degree, in order to ensure the complete formation of the via-hole penetrating the gate insulating layer 103 and the interlayered insulating layer 104, usually the layer may be over-etched by, e.g., 40% (i.e., the exposed pattern of the active layer at a position corresponding to the via-hole is over-etched in a thickness direction). It means that, the active layer at the position corresponding to the via-hole needs to be subjected to the etching process for a long period of time. As a result, the pattern of the active layer at the position corresponding to the via-hole will have a rough surface, and the metal-semiconductor electrical contact between the subsequently-formed source/drain electrodes and the pattern of the active layer will be seriously affected due to an increase in the roughness of the surface of the pattern of the active layer.

Figure 5:
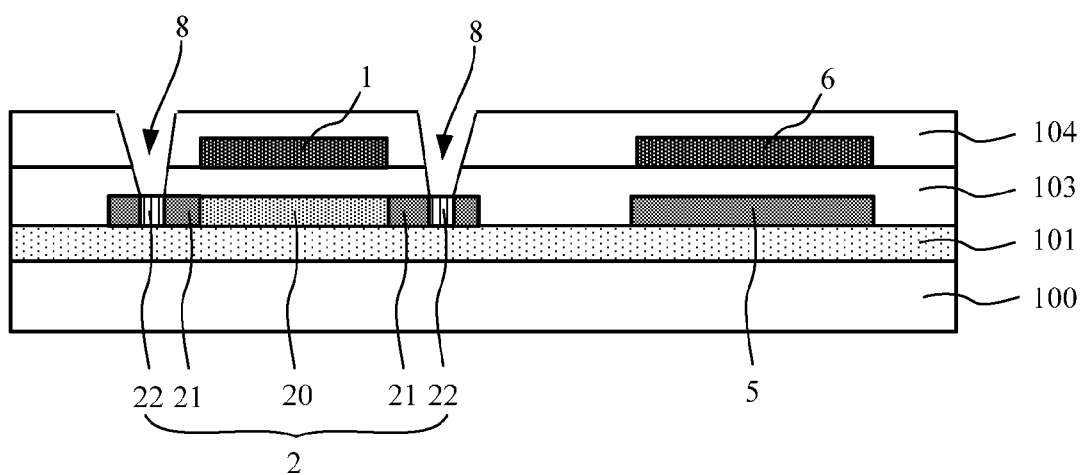
Figure 6:
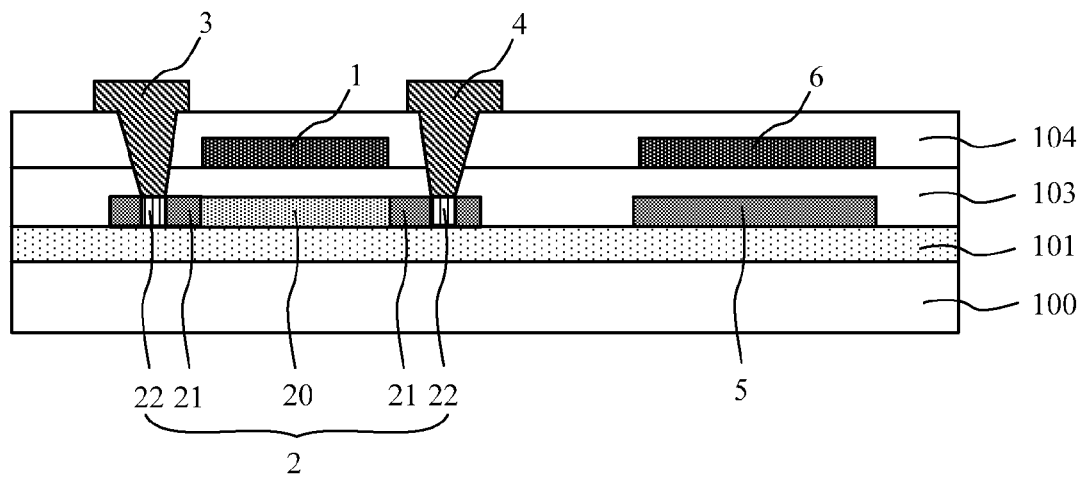

According to the embodiments of the present disclosure, as shown in FIGS. 5 and 6, before the formation of the source electrode 3 and the drain electrode 4, the exposed pattern of the active layer 2 is subjected to ion injection through the first via-hole 8 penetrating the gate insulating layer 103 and the interlayered insulating layer 104, so as to form the ion injection region 22. As a result, it is able to repair the damaged surface of the pattern of the active layer exposed at a position corresponding to the first via-hole 8, thereby to remarkably improve the metal-semiconductor contract property of the co-planar TFT.

Of course, the insulating structure arranged between the pattern of the active layer 2 and the source/drain electrodes is not limited to the gate insulating layer 103 and the interlayered insulating layer 104, and it may include any other insulating layer, which is not particularly defined herein.

In an illustrative embodiment, the pattern of the active layer 2 of the TFT may be made of poly-Si. Usually, in order to improve the metal-semiconductor contact property, two ends of the pattern of the active layer 2 (i.e., a region of the pattern of the active layer 2 other than a channel region) may be subjected to ion doping, so as to form a first doped poly-Si active layer 21, and the source electrode 3 and the drain electrode 4 are in electrical contact with the first doped poly-Si active layer 21 of the exposed pattern of the active layer 2 through the first via-hole 8. At this point, the pattern of the active layer 2 includes a poly-Si active layer 20 and the first doped poly-Si active layer 21 located at two sides of the poly-Si active layer 20. The pattern of the active layer 2 may be formed as follows.

At first, a buffer layer 101 is formed on the substrate 100, and it is usually made of SiNx/SiO$_2$. After the deposition, the buffer layer 101 is subjected to dehydrogenation at a high temperature, so as to prevent the semiconductor characteristics of the pattern of the active layer subsequently formed thereon from being adversely affected, as shown in FIG. 1.

Next, an a-Si film is formed on the buffer layer 101, and subjected to laser annealing crystallization so as to form a poly-Si film. The poly-Si film is then subjected to a patterning process (including processes of applying, exposing and developing photoresist as well as an etching process) to form the pattern of the active layer 2, as shown in FIG. 1.

Next, photoresist is applied onto the pattern of the active layer 2, and then exposed and developed so as to form a pattern of the photoresist 102.

Figure 2:
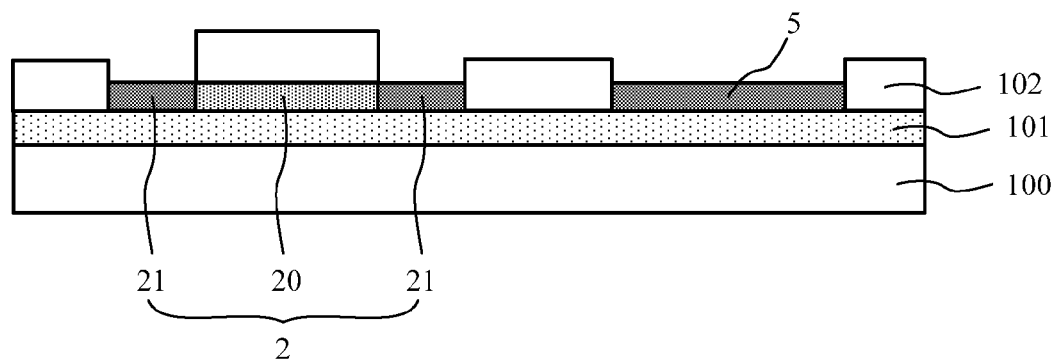

Finally, the two ends of the pattern of the active layer 2 are subjected to ion injection using the pattern of the photoresist 102 as a mask plate so as to form the first doped poly-Si active layer 21, as shown in FIG. 2, and then the remaining photoresist is removed.

The pattern of the active layer 2 formed through the above steps includes the poly-Si active layer 20 and the first doped poly-Si active layer 21 located at two sides of the poly-Si active layer 20.

Figure 3:
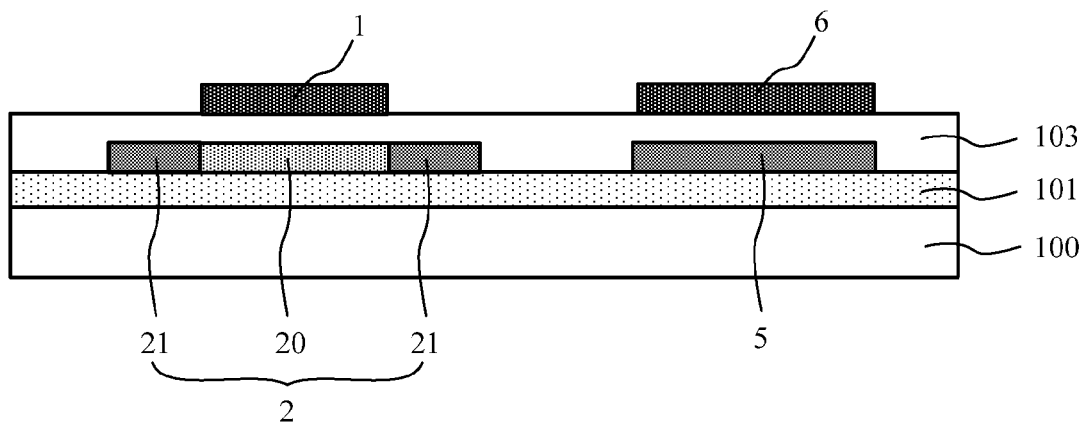

In order to achieve the display in a stable manner, the array substrate further includes a storage capacitor, which is configured to maintain a pixel voltage unchanged within a display time period for one frame. In one embodiment, the gate insulating layer 103 may serve as an insulating medium for the storage capacitor. When the pattern of the active layer 2 is made of poly-Si, a first electrode 5 of the storage capacitor and the pattern of the active layer 2 may be formed on the buffer layer 101 simultaneously, and a second electrode 6 of the storage capacitor and the gate electrode 1 may be formed on the gate insulating layer 103 simultaneously, as shown in FIG. 3.

To be specific, the procedure of forming the TFT and the storage capacitor will be described hereinafter.

At first, as shown in FIG. 1, an a-Si film is formed on the substrate 100, and then subjected to laser annealing crystallization so as to form a poly-Si film. The poly-Si film is then subjected to a patterning process (including processes of applying, exposing and developing photoresist as well as an etching process), so as to form the pattern of the active layer 2 and a pattern of the first electrode 5 of the storage capacitor.

Next, as shown in FIG. 2, photoresist is applied onto the pattern of the active layer 2 and the pattern of the first electrode 5 of the storage capacitor, and then exposed and developed so as to form the pattern of the photoresist 102. The two ends of the pattern of the active layer 2 are subjected to ion injection using the formed pattern of the active layer 102 as a mask plate, so as to form the first doped poly-Si active layer 21. Meanwhile, the pattern of the first electrode 5 of the storage capacitor is subjected to ion injection using the formed pattern of the photoresist 102 as a mask plate, so as to form a second doped poly-Si active layer, thereby to form the first electrode 5 of the storage capacitor. The remaining photoresist is then removed. The pattern of the active layer 2 formed through the above steps includes the poly-Si active layer 20 and the first doped poly-Si active layer 21 located at two sides of the poly-Si active layer 20.

Next, as shown in FIG. 3, the gate insulating layer 103 is formed on the pattern of the active layer 2 and the pattern of the first electrode 5 of the storage capacitor.

Finally, a gate metal layer is formed on the gate insulating layer 103, and then subjected to a patterning process so as to form patterns of the gate electrode 1 and the second electrode 6 of the storage capacitor. The first electrode 5 or the second electrode 6 of the storage capacitor is electrically connected to the pixel electrode of the array substrate, so as to maintain the pixel voltage of the pixel electrode unchanged within a time period. When the array substrate is an AMOLED array substrate, the pixel electrode is a cathode or an anode of the OLED, and it is electrically connected to the drain electrode of the TFT.

The storage capacitor of the array substrate is formed as mentioned above. Because the insulating medium for the storage capacitor merely includes the gate insulating layer and has relatively large capacity, it is able to achieve the display in a stable manner. Meanwhile, the storage capacitor is formed during the formation of the TFT, so it is able to simplify the manufacture process.

A method for manufacturing the array substrate will be described hereinafter in conjunction with FIGS. 1-8 by taking an AMOLED array substrate as an example. The method includes the following steps.

Step a: providing the substrate 100, e.g., a transparent glass substrate, quartz substrate or organic resin substrate.

Step b: forming the buffer layer 101 on the substrate 100. Usually, the buffer layer 101 is made of SiNx/SiO$_2$, and subjected to dehydrogenation at a high temperature after the deposition, so as to prevent the semiconductor characteristics of the active layer subsequently formed thereon from being affected adversely.

The buffer layer 101 may be of a single-layered structure, e.g., a SiN layer or $SiO_2$ layer, or a multi-layered structure, e.g., a combination of the SiN layer and the $SiO_2$ layer. Alternatively, the $SiO_2$ layer is arranged adjacent to the pattern of the active layer subsequently formed. The amount of H in the $SiO_2$ layer is relatively small, so it is able to prevent the semiconductor characteristics of the pattern of the active layer subsequently formed thereon from being adversely affected.

Step c: forming the pattern of the active layer 2 of the TFT and the first electrode 5 of the storage capacitor. This step may include the following steps.

Step c1: forming an a-Si film on the substrate 100 obtained at Step b, subjecting the a-Si film to laser annealing crystallization to form a poly-Si film, and subjecting the poly-Si film to a patterning process (including processes of applying, exposing and developing photoresist as well as an etching process) so as to form the pattern of the active layer 2 and the pattern of the first electrode 5 of the storage capacitor, as shown in FIG. 1.

To be specific, after the formation of the poly-Si film on the substrate 100, photoresist is applied onto the poly-Si film, and then exposed to form a photoresist reserved region corresponding to a region where the pattern of the active layer 2 and the first electrode 5 of the storage capacitor are located, and a photoresist unreserved region corresponding to the other regions. Next, the poly-Si film at the photoresist unreserved region is removed by dry etching. Finally, the photoresist at the photoresist reserved region is removed by a developing process, so as to form the pattern of the active layer 2 and the pattern of the first electrode 5 of the storage capacitor.

Step c2: applying photoresist onto the substrate 100 obtained at Step c1, exposing and developing the photoresist so as to form a photoresist reserved region 102 and a photoresist unreserved region as shown in FIG. 2, subjecting the two ends of the exposed pattern of the active layer 2 to ion injection using the formed photoresist reserved region 102 as a mask plate to form the first doped poly-Si active layer 21, subjecting the pattern of the first electrode 5 of the storage capacitor to ion injection so as to form the second doped poly-Si active layer as the first electrode 5 of the storage capacitor, and removing the remaining photoresist.

Step d: forming the gate insulating layer 103 on the substrate 100 obtained at Step c2, forming a gate metal layer on the gate insulating layer 103, and subjecting the gate metal layer to a patterning process so as to form the gate electrode 1 and the second electrode 6 of the storage capacitor. The gate insulating layer 103 serves as the insulating medium for the storage capacitor, as shown in FIG. 3.

The gate metal layer may be made of Cu, Al, Ag, Mo, Cr, Nd, Ni, Mn, Ti, Ta or W, or an alloy thereof. The gate metal layer may be of a single-layered structure, or a multi-layered structure such as Cu/Mo, Ti/Cu/Ti or Mo/Al/Mo. The gate metal layer having a thickness of about 2500 Å to 16000 Å may be deposited onto the substrate 100 by sputtering or thermal evaporation.

The gate insulating layer 103 may be of a double-layered structure consisting of any two of a $SiO_2$ layer, a SiON layer and a SiN layer, or a triple-layered structure consisting of the $SiO_2$ layer, the SiON layer and the SiN layer. Alternatively, the $SiO_2$ layer may be arranged adjacent to the pattern of the active layer 2. The amount of H in the $SiO_2$ layer is relatively small, so it is able to prevent the semiconductor characteristics of the pattern of the active layer from being adversely affected. To be specific, the gate insulating layer 103 may be formed on the substrate 100 obtained at Step c2 by coating, chemical deposition or sputtering.

Figure 4:
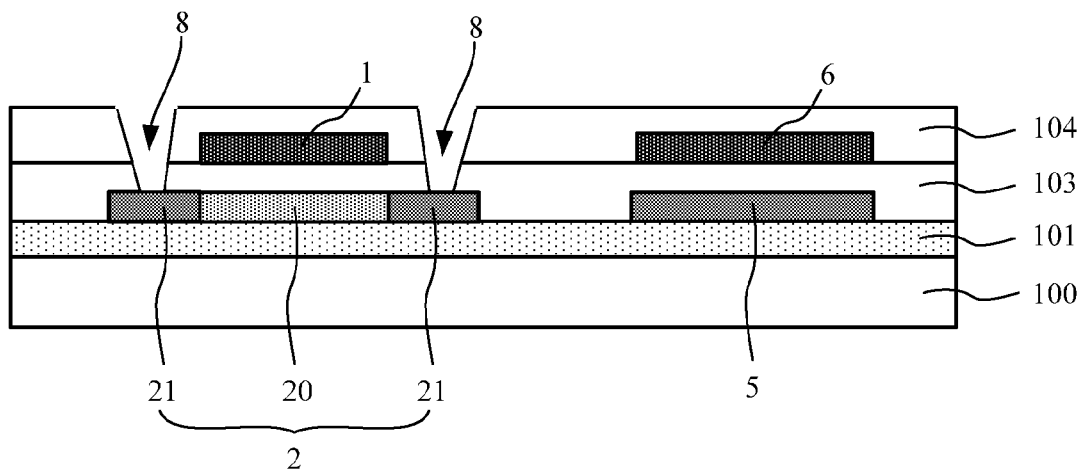

Step e: forming the interlayered insulating layer 104 on the substrate 100 obtained at Step d, and forming the first via-hole 8 in the gate insulating layer 103 and the interlayered insulating layer 104 by an etching process, so as to expose the first doped poly-Si active layer 21, as shown in FIG. 4.

To be specific, the interlayered insulating layer 104 may be formed on the gate electrode 1 and the second electrode 6 of the storage capacitor by coating, chemical deposition or sputtering. The interlayered insulating layer 104 may be an inorganic insulating layer, e.g., a double-layered structure consisting of any two of a $SiO_2$ layer, a SiON layer and a SiN layer, or a triple-layered structure consisting of the $SiO_2$ layer, the SiON layer and the SiN layer.

Then, the first via-hole 8 penetrating the gate insulating layer 103 and the interlayered insulating layer 104 by over-etching, and 40% of the first doped poly-Si active layer 21 in a thickness direction is etched off, so as to enable the first via-hole 8 to extend to an interior of the exposed first doped poly-Si active layer 21, thereby to form the first via-hole 8 completely penetrating the gate insulating layer 103 and the interlayered insulating layer 104 by etching.

Step f: subjecting the exposed first doped poly-Si active layer 21 to ion injection through the first via-hole 8, so as to form the ion injection region 22, as shown in FIG. 5, thereby to form the pattern of the active layer 2 including the poly-Si active layer 20, the first doped poly-Si active layer 21 located at two sides of the poly-Si active layer 20, and the ion injection region 22 arranged in the first doped poly-Si active layer 21 and at a position corresponding to the first via-hole 8.

Step g: forming a source-drain metal layer on the substrate 100 obtained at Step f, and subjecting the source-drain metal layer to a patterning process so as to form the source electrode 3 and the drain electrode 4, as shown in FIG. 6.

The source-drain metal layer may be made of Cu, Al, Ag, Mo, Cr, Nd, Ni, Mn, Ti, Ta or W, or an alloy thereof. It may be of a single-layered structure, or a multi-layered structure such as Cu/Mo, Ti/Cu/Ti or Mo/Al/Mo. To be specific, the source-drain metal layer having a thickness of about 2000 Å to 6000 Å may be deposited on to the substrate 100 obtained at Step f by magnetron sputtering, thermal evaporation or any other film-forming method.

A layer of photoresist is applied onto the source-drain metal layer, and then exposed and developed using a mask plate, so as to form a photoresist reserved region corresponding to a region where the source electrode 3 and the drain electrode 4 are located, and a photoresist unreserved region corresponding to the other region. The source-drain metal layer at the photoresist unreserved region is fully etched off by wet etching, and the remaining photoresist is removed, so as to form the source electrode 3 and the drain electrode 4.

Figure 7:
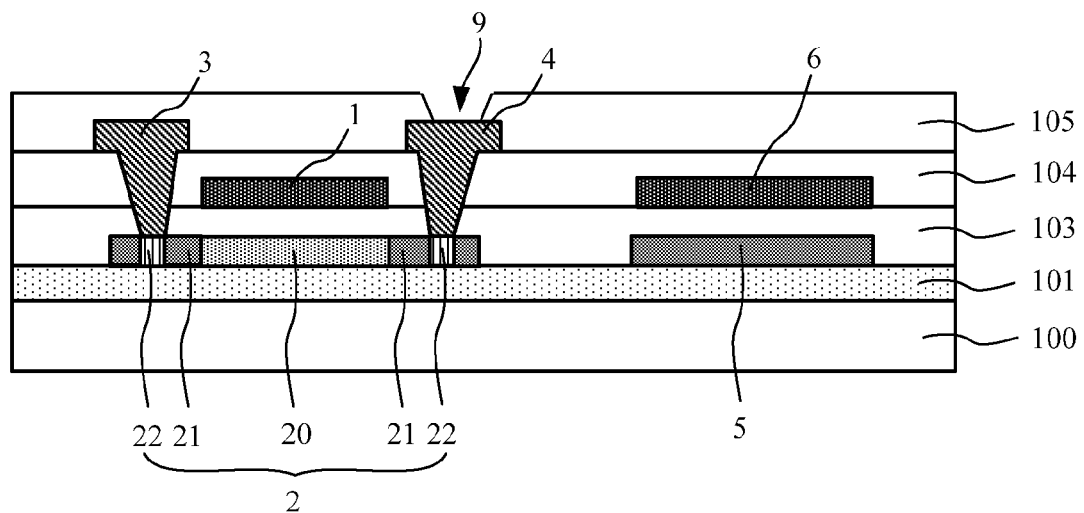

Step h: as shown in FIG. 7, forming a planarization layer 105 on the substrate 100 obtained at Step g, and forming a second via-hole 9 in the planarization layer 105 by an etching process, so as to expose the drain electrode 4. Alternatively, the planarization layer 105 is an organic insulating layer, so as to reduce a parasitic capacitance of the display panel.

Step i: as shown in FIG. 8, forming a cathode 7 of an organic light-emitting diode (OLED) on the substrate 100 obtained at Step h, and forming the passivation layer 106 on the cathode 7, the passivation layer 106 covering the TFT.

The cathode 7 is in electrical contact with the drain electrode 4 through the second via-hole 9, and connected to the second electrode 6 of the storage capacitor through an electrical connection structure, so as to enable the storage capacitor to maintain an unchanged pixel voltage on the cathode 7 within a display time period for one frame, thereby to achieve the display in a stable manner. The cathode 7 may be made of Ag/indium tin oxide (ITO), because Ag may reflect light and ITO is of well light transmission.

Processes for manufacturing other structures of the AMO-LED, e.g., an organic light-emitting layer, an anode, an electron transmission layer and a hole transmission layer, are known in the art, and thus will not be particularly defined herein.

As shown in FIG. 8, the AMOLED array substrate formed through the above steps includes: the buffer layer 101 arranged on the substrate 100; the pattern of the active layer 2 and the first electrode 5 of the storage capacitor arranged on the buffer layer 101, and the ion injection region 22; the pattern of the active layer 2 including the poly-Si active layer 20 and the first doped poly-Si active layer 21 located at two sides of the poly-Si active layer 20, the ion injection region 22 being arranged in the first doped poly-Si active layer 21, and a second doped poly-Si active layer serving as the first electrode 5 of the storage capacitor; the gate insulating layer 103 covering the pattern of the active layer 2 and the first electrode 5 of the storage capacitor, and serving as an insulating medium for the storage capacitor; the gate electrode 1 and the second electrode 6 of the storage capacitor arranged on the gate insulating layer 103, and formed by an identical gate metal layer; the interlayered insulating layer 104 covering the gate electrode 1 and the second electrode 6 of the storage capacitor, the first via-hole 8 being formed in the gate insulating layer 103 and the interlayered insulating layer 104 and extending to an interior of the ion injection region 22; the source electrode 3 and the drain electrode 4 arranged on the interlayered insulating layer 104, the source electrode 3 and the drain electrode 4 being in contact with the ion injection region 22 through the first via-hole 8 and thereby in electrical contact with the first doped poly-Si active layer 21; the planarization layer 105 covering the source electrode 3 and the drain electrode 4, the second via-hole 9 being formed in the planarization layer 105 so as to expose the drain electrode 4; the cathode 7 of the OLED arranged on the planarization layer 105, the cathode 7 being in electrical contact with the drain electrode 4 through the second via-hole 9, and the first electrode 5 of the storage capacitor being electrically connected to the cathode 7 of the OLED; and the passivation layer 106 covering the TFT.

Similarly, the AMOLED may further include other structures, such as an organic light-emitting layer, an anode, an electron transmission layer and a hole transmission layer, which are not particularly defined herein.

Of course, the array substrate may also be applied to a liquid crystal display panel. During the manufacture of the liquid crystal display panel, the steps for manufacturing the TFT are identical to the above Steps a-i, but the pixel electrode of the liquid crystal display panel can only be made of a transparent material such as ITO. The manufacture processes for such structures as the storage capacitor and the common electrode are known in the art, and thus will not be particularly defined herein.

The present disclosure further provides in one embodiment a display device including the above-mentioned array substrate. Because the performance of the TFT on the array substrate is improved, it is able to ensure the display quality of the display device. The display device may be any product or component having a display function, such as a liquid crystal panel, an electronic paper, a liquid crystal TV, a liquid crystal display, a digital photo frame, a mobile phone or a flat-panel PC.

According to the embodiments of the present disclosure, the source electrode and the drain electrode of the TFT are located above the pattern of the active layer, and electrically connected to the pattern of the active layer through the first via-hole penetrating the insulating structure. Before the formation of the source electrode and the drain electrode, the exposed pattern of the active layer is subjected to ion injection through the first via-hole penetrating the insulating structure, so as to form the ion injection region. As a result, it is able to repair the damaged surface of the pattern of the active layer due to an etching process for forming the via-hole, thereby to improve the metal-semiconductor electrical contact between the source/drain electrode and the pattern of the active layer, improve the electrical characteristic of the TFT and ensure the display quality of the display device.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A method for manufacturing an array substrate, comprising a step of forming a thin film transistor (TFT); wherein the step of forming the TFT comprises:
   forming a pattern of an active layer on a substrate;
   forming an insulating structure on the pattern of the active layer;
   forming a first via-hole penetrating the insulating structure so as to expose the pattern of the active layer at a position corresponding to the first via-hole, the first via-hole extending to an interior of the exposed pattern of the active layer;
   subjecting the exposed pattern of the active layer to ion injection through the first via-hole, so as to form an ion injection region located in pattern of the active layer; and
   forming a source electrode and a drain electrode on the insulating structure, the source electrode and the drain electrode being in contact with a surface of the ion injection region through the first via-hole so as to be electrically connected to the pattern of the active layer.

2. The method according to claim 1, wherein the insulating structure comprises at least two insulating layers.

3. The method according to claim 1, wherein the step of forming the insulating structure on the pattern of the active layer comprises forming a gate insulating layer and an interlayered insulating layer.

4. The method according to claim 3, further comprising forming a gate electrode between the gate insulating layer and the interlayered insulating layer; wherein the gate electrode is arranged on the gate insulating layer at a position corresponding to the pattern of the active layer.

5. The method according to claim 3, further comprising forming a storage capacitor; wherein the gate insulating layer is an insulating medium for the storage capacitor.

6. The method according to claim 5, further comprising:
step 1 of forming a poly-Si film on the substrate, and forming the pattern of the active layer and a pattern of a first electrode of the storage capacitor by a patterning process;
step 2 of applying photoresist onto the pattern of the active layer and the pattern of the first electrode of the storage capacitor, and exposing and developing the photoresist so as to expose a region of the pattern of the active layer other than a channel region of the active layer, and the pattern of the first electrode of the storage capacitor;
step 3 of subjecting the region of the pattern of the active layer other than the channel region of the active layer and the pattern of the first electrode of the storage capacitor to ion injection using the photoresist as a mask plate, so as to form a first doped poly-Si active layer and a second doped poly-Si active layer, the second doped poly-Si active layer serving as the first electrode of the storage capacitor;
step 4 of forming the gate insulating layer on the pattern of the active layer and the pattern of the first electrode of the storage capacitor;
step 5 of forming a gate metal layer on the gate insulating layer, and forming the gate electrode and a pattern of a second electrode of the storage capacitor by a patterning process;
step 6 of forming the interlayered insulating layer on the gate electrode and the pattern of the second electrode of the storage capacitor;
step 7 of forming the first via-hole penetrating the gate insulating layer and the interlayered insulating layer, so as to expose the first doped poly-Si active layer at a position corresponding to the first via-hole, the first via-hole extending to an interior of the exposed first doped poly-Si active layer;
step 8 of subjecting the exposed first doped poly-Si active layer to ion injection through the first via-hole, so as to form an ion injection region; and
step 9 of forming the source electrode and the drain electrode on the interlayered insulating layer, the source electrode and the drain electrode being in contact with a surface of the ion injection region through the first via-hole, and thereby in electrical contact with the first doped poly-Si active layer.

7. The method according to claim 5, wherein the array substrate is an active matrix organic light-emitting diode (AMOLED) array substrate, and the method further comprises:
forming a planarization layer on the source electrode and the drain electrode;
forming a second via-hole in the planarization layer, so as to expose the drain electrode; and
forming a cathode of an organic light-emitting diode on the planarization layer, the cathode being in electrical contact with the drain electrode through the second via-hole, and the storage capacitor being electrically connected to the cathode.

8. The method according to claim 1, wherein the first via-hole extends to a depth located within the interior of the exposed pattern of the active layer.

9. An array substrate comprising a thin film transistor (TFT); wherein the TFT comprises:
a pattern of an active layer on a substrate;
an insulating structure covering the pattern of the active layer, a first via-hole being formed in the insulating structure and extending to an interior of an exposed pattern of the active layer;
an ion injection region located in the pattern of the active layer and at a position corresponding to the first via-hole; and
a source electrode and a drain electrode arranged on the insulating structure, the source electrode and the drain electrode being in contact with a surface of the ion injection region through the first via-hole so as to be electrically connected to the pattern of the active layer.

10. The array substrate according to claim 9, wherein the insulating structure comprises at least two insulating layers.

11. The array substrate according to claim 9, wherein the insulating structure comprises a gate insulating layer and an interlayered insulating layer.

12. The array substrate according to claim 11, wherein a gate electrode is arranged between the gate insulating layer and the interlayered insulating layer, and on the gate insulating layer at a position corresponding to the pattern of the active layer.

13. The array substrate according to claim 12, further comprising a storage capacitor; wherein the gate insulating layer serves as an insulating medium for the storage capacitor.

14. The array substrate according to claim 13, further comprising a pattern including the active layer and a first electrode of the storage capacitor arranged on the substrate;
wherein the pattern of the active layer comprising a poly-Si active layer, first doped poly-Si active layers located at two sides of the poly-Si active layer and the ion injection region; wherein the ion injection region is arranged in the first doped poly-Si active layers, the pattern of the first electrode of the storage capacitor is subjected to ion injection so as to form a second doped poly-Si active layer as the first electrode of the storage capacitor;
wherein the gate insulating layer covers the pattern of the active layer and the pattern of the first electrode of the storage capacitor;
wherein the gate electrode and a second electrode of the storage capacitor are arranged on the gate insulating layer, and formed by an identical gate metal layer;
wherein the interlayered insulating layer covers the gate electrode and the second electrode of the storage capacitor; the first via-hole penetrates the gate insulating layer and the interlayered layer and extends to an interior of the ion injection region; and
wherein the source electrode and the drain electrode are arranged on the interlayered insulating layer, the source electrode and the drain electrode are in contact with the surface of the ion injection region through the first via-hole and thereby in electrical contact with the first doped poly-Si active layer.

15. The array substrate according to claim 9, wherein the array substrate is an active matrix organic light-emitting diode (AMOLED) array substrate, and the array substrate further comprises:
a planarization layer covering the source electrode and the drain electrode, a second via-hole being formed in the planarization layer so as to expose the drain electrode; and
a cathode of an organic light-emitting diode arranged on the planarization layer, the cathode being in electrical contact with the drain electrode through the second via-hole, and the storage capacitor being electrically connected to the cathode.

16. A display device comprising the array substrate according to claim 9.

17. A method for manufacturing an array substrate, comprising:
a step of forming a thin film transistor (TFT),
wherein the step of forming the TFT comprises steps of:
forming a pattern of an active layer on a substrate;
forming an insulating structure on the pattern of the active layer;
forming a first via-hole penetrating the insulating structure so as to expose the pattern of the active layer at a position corresponding to the first via-hole, the first via-hole extending to an interior of the exposed pattern of the active layer;
repairing a surface of the exposed pattern of the active layer;
after the surface of the exposed pattern of the active layer is repaired, forming a source electrode and a drain electrode on the insulating structure, the source electrode and the drain electrode being in contact with the surface of the exposed pattern of the active layer through the first via-hole so as to be electrically connected to the pattern of the active layer.

18. The method according to claim 17, wherein the step of repairing the surface of the exposed pattern of the active layer comprises:
subjecting the exposed pattern of the active layer to ion injection through the first via-hole, so as to form an ion injection region located in pattern of the active layer.

19. The method according to claim 17, wherein before the step of forming the insulating structure on the pattern of the active layer, the method further comprises:
applying photoresist onto the pattern of the active layer, and exposing and developing the photoresist so as to expose a region of the pattern of the active layer other than a channel region of the active layer; and
subjecting the region of the pattern of the active layer other than the channel region of the active layer to ion injection using the photoresist as a mask plate, so as to form a first doped active layer;
wherein the step of forming the first via-hole penetrating the insulating structure so as to expose the pattern of the active layer at the position corresponding to the first via-hole comprises:
forming the first via-hole penetrating the insulating structure, thereby exposing the first doped active layer at a position corresponding to the first via-hole, the first via-hole extending to an interior of the exposed first doped active layer.

20. The method according to claim 17, wherein the first via-hole extends to a depth located within the interior of the exposed pattern of the active layer.

* * * * *